(12) United States Patent
Brandl

(10) Patent No.: US 7,459,368 B2
(45) Date of Patent: Dec. 2, 2008

(54) METHOD FOR MANUFACTURING INTEGRATED CIRCUITS HAVING SILICON-GERMANIUM HETEROBIPOLAR TRANSISTORS

(75) Inventor: Peter Brandl, St. Georgen (AT)

(73) Assignee: Atmel Germany GmbH, Heilbronn (DE)

(*) Notice: Subject to any disclaimer, the term of this patent is extended or adjusted under 35 U.S.C. 154(b) by 1 day.

(21) Appl. No.: 11/882,571

(22) Filed: Aug. 2, 2007

(65) Prior Publication Data
US 2008/0081425 A1    Apr. 3, 2008

Related U.S. Application Data

(63) Continuation of application No. PCT/EP2006/000711, filed on Jan. 27, 2006.

(30) Foreign Application Priority Data
Feb. 2, 2005    (DE) ............... 10 2005 004 707

(51) Int. Cl.
*H01L 21/8222* (2006.01)
(52) U.S. Cl. .............. 438/309; 438/312; 438/340
(58) Field of Classification Search .......... 438/309–378
See application file for complete search history.

(56) References Cited

U.S. PATENT DOCUMENTS

| | | |
|---|---|---|
| 5,385,861 A | 1/1995 | Bashir et al. |
| 5,403,757 A * | 4/1995 | Suzuki ............... 438/362 |
| 5,912,678 A | 6/1999 | Saxena et al. |
| 2004/0222486 A1 | 11/2004 | Ellis-Monaghan et al. |

FOREIGN PATENT DOCUMENTS

| | | |
|---|---|---|
| DE | 19758339 A1 | 6/1999 |
| DE | 10152089 A1 | 5/2003 |
| EP | 0263756 A2 | 4/1988 |

(Continued)

OTHER PUBLICATIONS

Van Huylenbroeck S et al: "Lateral and vertical scaling of a QSA HBT for a 0.13/spl mu/m 200GHz SiGe:C BiCMOS technology" Bipolar BICMOS Circuits and Technology, 2004. Proceedings of the 2004 Meeting Montreal, Sep. 12, 2004, pp. 229-232.

(Continued)

*Primary Examiner*—H. Jey Tsai
(74) *Attorney, Agent, or Firm*—Muncy, Geissler, Olds & Lowe, PLLC

(57) ABSTRACT

Method for manufacturing integrated circuits having silicon-germanium heterobipolar transistors, wherein a collector semiconductor region is created, an etch stop layer is created on a connection region, an opening is introduced into this etch stop layer, semiconductor material, which is formed as a single crystal at least in the collector semiconductor region above the opening, is applied over the etch stop layer and over the opening. Before etching of the semiconductor material, a masking layer is applied above the collector semiconductor region to the semiconductor material, which protects the collector semiconductor region from the etching. Afterwards the semiconductor material is etched to the depth of the etch stop layer, the etch stop layer acting as an etch stop such that reaching an interface between the semiconductor material and the etch stop layer is detected during the etching and the etching is stopped depending on the detection.

6 Claims, 2 Drawing Sheets

FOREIGN PATENT DOCUMENTS

| | | |
|---|---|---|
| EP | 0430279 A2 | 6/1991 |
| JP | 58153349 | 9/1983 |
| JP | 62213258 | 9/1987 |
| WO | WO 02/103776 A2 | 12/2002 |

OTHER PUBLICATIONS

John P et al: "Elimination of NPN C-E Leakage Yield Loss on SiGe: C HBTBiCMOS Technology through Optimization of Critical Wet Chemical Wafer treatments" 2003 IEEE International Symposium on Semiconductor Manufacturing. Conference Proceedings. (ISSM 2003). San Jose, CA, Sep. 30-Oct. 2, 2003, IEEE International Symposium on Semiconductor Manufacturing, New York, NY : IEEE, US, Sep. 30, 2003, pp. 411-414.

Kempf P et al: "Silicon Germanium BICMOS Technology" GAAS IC Symposium. 24TH. Annual IEEE Gallium Arsenide Intefrated Circuit Symposium. Technical Digest 2002. Monterey, CA, Oct. 20-23, 2002, GAAS IC Symposium—IEEE Gallium Arsenide Integrated Circuit Symposium, New York, NY: IEEE, US, Oct. 20, 2002, pp. 3-6.

Osten H J et al: "Dopant diffusion control by adding carbon into Si and SiGe: principles and device application" Materials Science and Engineering B, Elsevier Sequoia, Lausanne, CH, vol. 87, No. 3, Dec. 19, 2001, pp. 262-270.

Widmann et al., "Large-Scale Integrated Circuit Technology", Springer Verlag, Second Edition, 1996, pp. 206-210.

* cited by examiner

METHOD FOR MANUFACTURING INTEGRATED CIRCUITS HAVING SILICON-GERMANIUM HETEROBIPOLAR TRANSISTORS

This nonprovisional application is a continuation of International Application No. PCT/EP2006/000711, which was filed on Jan. 27, 2006, and which claims priority to German Patent Application No. DE 102005004707, which was filed in Germany on Feb. 2, 2005, and which are both herein incorporated by reference.

BACKGROUND OF THE INVENTION

1. Field of the Invention

The present invention relates to a method for manufacturing integrated circuits having silicon-germanium heterobipolar transistors.

2. Description of the Background Art

Integrated semiconductor circuits and methods for manufacturing the same, which have heterobipolar transistors with a silicon-germanium mixed crystal in the base semiconductor region, are known from the state of the art.

SUMMARY OF THE INVENTION

It is an object of the present invention to provide a method for manufacturing integrated circuits.

Accordingly, the creation of a collector semiconductor region is provided in a method for manufacturing integrated circuits having silicon-germanium heterobipolar transistors.

In so doing, first an etch stop layer is created on a connection region. This etch stop layer may also be etchable by the etchant in this case. Another variant of the invention, however, uses an etch stop layer made of a material that has a much lower etch rate with the employed etchant compared to the material to be etched.

An opening is introduced in this etch stop layer before the etching. This opening may extend here over subareas of the connection region, over the entire connection region, or beyond it. The geometry of the opening in this case depends on the later desired geometry of the collector semiconductor region and should therefore preferably include this geometrically.

Semiconductor material is applied over the etch stop layer and over the opening. Silicon, to which other substances, particularly for doping, such as phosphorus or boron, can be added, is used preferably as the semiconductor material. The semiconductor material is thereby formed as a single crystal at least in the collector semiconductor region above the opening.

Before etching of the semiconductor material, a masking layer is applied to the semiconductor material above the collector semiconductor region. This masking layer preferably contains silicon nitride, which has a lower etch rate than silicon compared with the employed etchant. The masking layer has the effect that the collector semiconductor region is protected from the etch attack during etching.

Afterwards the semiconductor material is etched to the depth of the etch stop layer. "Afterwards" is taken to mean here that the etching occurs at a later time in the process sequence, it being possible for other process steps, such as for example, stripping of a resist to occur between the application of the masking layer and the etching. The etch stop layer in this case acts as an etch stop that detects the reaching of an interface between the semiconductor material and the etch stop layer during the etching and the etching is stopped depending on this detection. The detection can occur here, for example, with the use of optical reflection or a spectral analysis. The stopping has the effect that the etching is stopped just below the interface, so that the etch stop layer is thinned only slightly.

An embodiment of the invention provides that the connection region is formed as a single crystal at least in the area of the opening. To achieve single-crystal growth, the lattice of the applied semiconductor material must be matched to the lattice of the connection region. Apart from similar materials, mixed crystal or single-crystal silicides, for example, of titanium and silicon, may also be used.

Another embodiment of the invention provides that a silicon dioxide layer ($SiO_2$) is applied as an etch stop layer or that silicon is applied epitaxially as the semiconductor material and doped in situ.

Another aspect of the invention is a method for manufacturing integrated circuits having silicon-germanium heterobipolar transistors, a modularization of the manufacturing process being provided. The manufacturing process is divided into several process modules. A process module hereby has one, preferably however has at least two process steps of the manufacturing process. For the division, according to the invention, several or all process steps are combined into modules.

Defined as process modules are: a connection module to create an especially buried connection region; a collector/emitter module to create a collector region, adjacent to the connection region, and/or an emitter region, adjacent to the connection region; and a base module to create a base region.

A connection area is understood to be a conductive region that is adjacent to an active semiconductor region and that is arranged preferably relative to the wafer surface at least partially below the active semiconductor region, particularly of the heterobipolar transistor. The active semiconductor region is advantageously at least partially a single crystal. The semiconductor region of the base is preferably directly adjacent to the collector region and/or the emitter region, which is made as a single crystal at least at the interface.

The nature of this aspect of the invention here is the development of a technology version, different from the existing technology version, in that the process modules have such process interfaces relative to one another that at least one process step of a process module with maintenance of the process interface is changed independent of the process steps of the other process modules for the different technology version.

The process interfaces preferably have one or more process conditions that relate to processes of at least two modules. For example, a high-temperature epitaxy process step in the collector/emitter module relates to both the diffusion and thus the dopant distribution of the dopants, introduced in the connection module, and also the diffusion and thus the dopant distribution of the dopants, introduced in the collector/emitter module, said dopants which diffuse during the high-temperature epitaxy process step.

Technology versions differ when the electrical properties of at least one integrated element change with the change in technology. Preferably, the heterobipolar transistor is adapted to the desired specifications with the new technology version.

The creation of the preferably high-doped, metallic, and/or silicided leads for the aforementioned regions can thereby be a component of the specific process module and/or form one or more separate process modules.

According to an aspect of the invention, at least one process module can have at least two module variants. The module variants thereby are used in one and the same technology version to create different elements with a reduced number of necessary process steps. Preferably, the at least two module variants are carried out in the same integrated circuit. For example, a first module variant can be designed to create a collector region and a second module variant for at least partial parallel creation of an emitter region.

Another embodiment of the invention provides that a first of the process interfaces can be placed between the connection module and collector/emitter module in a sequence of the process steps before an epitaxial application of semiconductor material of the collector region and/or the emitter region.

An embodiment of the invention provides that to develop a new technology generation different from an existing technology generation, at least one process interface condition of at least one of the process interfaces can be changed. In this case, the result of this modification is that versioning no longer occurs. Compatibility of the technology versions among one another, which is made possible by versioning, is thereby relinquished to enable more significant adjustments of the overall manufacturing process to new requirements for electrical properties with additional degrees of freedom. In order to simplify the testing of the new technology generation as much as possible, it is thereby preferably provided that at most three process interface conditions of the process interfaces are changed.

In another embodiment of the invention, it is provided that at least one of the process interfaces has at least one process interface condition, which is dependent on at least two process parameters variable within specified regions. Their variability is thereby preferably limited by the process interface condition or by other process conditions. Process parameters can thereby be all manufacturing process parameters adjustable within one or more process steps, such as, for example, an implantation dose, implantation energy, the duration of a tempering step, or the duration of an etching.

The process interface condition makes it possible furthermore to change the process parameters for the different technology version, whereby the process parameters in combination, however, must continue to fulfill the process interface condition. The combination of the process parameters can be established, for example, by an algorithm, in the simplest cases by a summation or multiplication. The process interface condition is thereby preferably multidimensional. Advantageously, the process interface condition by suitable degrees of freedom in the variability of the process parameters enables flexibility in the design of the different technology version.

An embodiment of this development of the invention provides that the process interface condition can be a diffusion length, which depends on a dopant, a dopant concentration, and a thermal budget of subsequent process modules as variable process parameters. Accordingly, with maintenance of the condition of the diffusion length, both the dopant, the dopant concentration, as well as the thermal budget can be changed in combination and the technology can hereby be versioned.

This first of the process interfaces can be defined at least by an oxide layer on the connection region with or without a window opening. Thus, the window opening can be introduced virtually as desired at the end of the first module or at the beginning of the second module. It is important that an oxide layer, which can act as a stop layer for later etching processes, remains outside the area of the opening.

Developing the invention further, the first process interface can be defined by a dopant, a dopant concentration, and the thermal budget of subsequent process modules. Other interface conditions are, for example, the surface quality before the second modules or defined insulator regions.

Another aspect of the invention provides that the connection module preferably has the process steps: etching of a trench in a semiconductor substrate and creation of isolation walls of the trench by means of a dielectric; and in addition the process steps; filling of the trench by application of a silicon layer; anisotropic back etching of the silicon layer except for a residual layer remaining outside the trench; and oxidation of the residual layer and planarization of the oxide layer.

In an embodiment of the invention, in a first module variant a higher dopant concentration is introduced in a first, particularly buried connection region than in a second, particularly buried connection region of a second module variant, so that a collector drift zone is shortened by the greater diffusion length of the first module variant.

Another embodiment provides that a second of the process interfaces is placed between the collector/emitter module and base module in a sequence of the process steps before the base region is created. Especially preferably, this second of the process interfaces is defined at least by a planarized dielectric, particularly of silicon dioxide, and placed advantageously after the planarization of the dielectric. This can be, for example, a second process interface to the aforementioned interface, so that the manufacturing process has at least three process modules.

As a further embodiment of the invention, it is preferred that this second of the process interfaces is defined at least by a tolerance of the thickness of the dielectric acting as a field oxide of less than 10%, preferably less than 5%.

Another embodiment of the invention provides that this second of the process interfaces is defined at least by a maximum damage density of the collector semiconductor region adjacent to a base semiconductor region, with advantageously less than 10 dislocations to 1000 $\mu m^2$, particularly caused by point defects or stacking faults, preferably less than 3 dislocations to 1000 $\mu m^2$, particularly caused by point defects or stacking faults.

Damage to the crystal lattice can be caused, for example, by implantation energies, which lead to defects in the near-surface area of the crystal lattice. Damage of this type is especially critical in the area of the PN junction between the collector semiconductor region and the base semiconductor region. Elimination of such damage is therefore advantageously permanently assigned to a module.

Within the base module, in a preferred embodiment of the invention, a silicon-germanium mixed crystal is applied epitaxially to create the base region.

Another aspect of the invention is the use of the previously described manufacturing process for an integrated circuit to adapt the technology version to application-specific boundary conditions. Similarly, an aspect of the invention is the use of the method for manufacturing an integrated high-frequency circuit having at least one silicon-germanium heterobipolar transistor.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
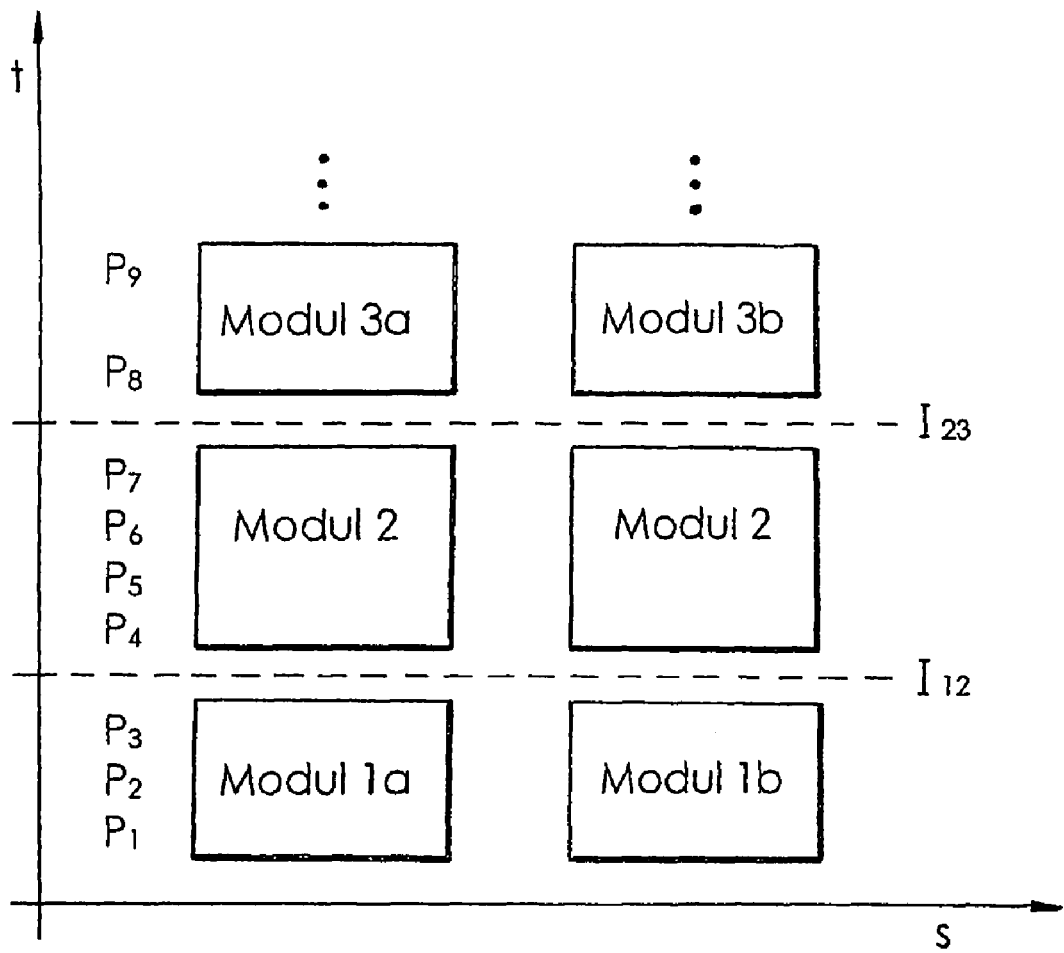
FIG. 1 illustrates process modules with assigned process interfaces.

According to FIG. 1, a manufacturing process for an integrated circuit having a silicon-germanium heterobipolar transistor is divided into several process modules: module 1a, module 1b, module 2, module 3a, and module 3b. In this respect, the module division in the exemplary embodiment of FIG. 1 shows a first module variant, module 1a, for the first module (module 1a/module 1b) and a second module variant, module 1b, as well as the module variants, module 3a and module 3b, for the third module.

The exemplary embodiment of FIG. 1 shows by way of example the advantageous division into three process modules, it being possible to combine both module variant 1a with module 2 and module variant 3a, module variant 1a with module 2 and module variant 3b, module variant 1b with module 2 and module variant 3a, and module variant 1b with module 2 and module variant 3b, in order to create transistors having different electrical properties on a semiconductor chip. The first module (module 1a, module 1b), the second module 2, and the third module (module 3a, 3b) according to the exemplary embodiment of FIG. 1 follow one after another in time t.

The modules, module 1a, module 1b, module 2, module 3a, and module 3b, each have one [or] several process steps P1 to P3, P4 to P7, or P8 to P9, respectively, of the manufacturing process, which are also identical for different module variants. Variants of the modules can be created, for example, by appropriate masking and thereby by a lateral offset s on the wafer.

The modules, module 1a, module 1b, module 2, module 3a, and module 3b, are thereby defined relative to each other by process interfaces $I_{12}$, $I_{23}$. In the exemplary embodiment of FIG. 1, the process interfaces 112, 123 are arranged in time between the first module, module 1a, module 1b, and the second module, module 2, and between the second module, module 2, and the third module, module 3a and module 3b. An interface, not shown in FIG. 1, between the first module, module 1a, module 1b, and the third module, module 3a, module 3b, is also possible.

The invention is thereby not limited to the exemplary embodiment shown in FIG. 1. It is possible to add additional modules and interfaces by suitable definition. Additional modules are indicated in FIG. 1 by dots.

For example, module 1 is a buried connection region, for instance, for the electrical contacting of a collector semiconductor region or an emitter semiconductor region of the heterobipolar transistor. Module variant 1a, in comparison with module variant 1b, has a lower dopant concentration or a different dopant, so that the thermal budget, defined in the subsequent modules 2 and 3, leads to different diffusion of the dopant, introduced into module 1, into semiconductor layers arranged above during modules 2 and 3. If this semiconductor layer is, for example, an active collector semiconductor region, both module variants 1a and 1b accordingly create different collector drift zones for heterobipolar transistors with different high-frequency properties. Furthermore, the module variants 3a and 3b can create, for example, different base regions.

If proceeding from process steps P1 to P9, assigned to the modules, a new technology generation with new heterobipolar transistors with, for example, a higher breakdown voltage stability is desired, only process steps P4 to P7 of module 2 are changed in this case. The other process steps, P1 to P3 and P8 to P9, remain unchanged. The options for changing process steps P4 to P7 of module 2 are thereby limited by the defined interfaces $I_{12}$ and $I_{23}$. In other words, the interface-defined boundary conditions for process steps P4 to P7 remain unchanged.

For example, module 1 according to process interface $I_{12}$ requires a certain thermal budget due to the following module 2. If process steps P4 to P7 for the new technology version in new process steps (P4' to P7', not shown in FIG. 1) are changed, adherence to the thermal budget is absolutely necessary. If the thermal budget, for example, is too low, a thermal replacement process must be added, which is used exclusively to maintain the process interface condition.

Figure 2A:
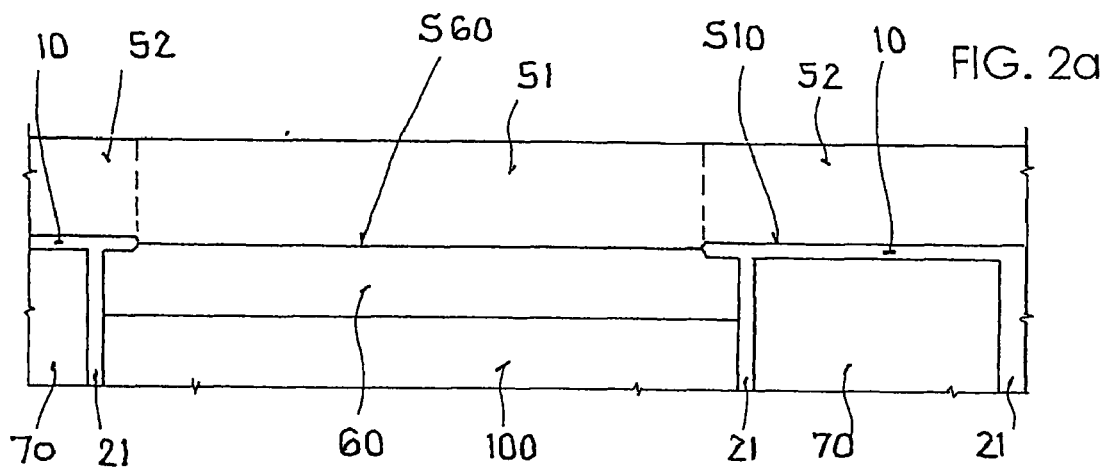
FIG. 2a illustrates a first schematic sectional view after the process steps of the manufacture of an integrated circuit.
Figure 2B:
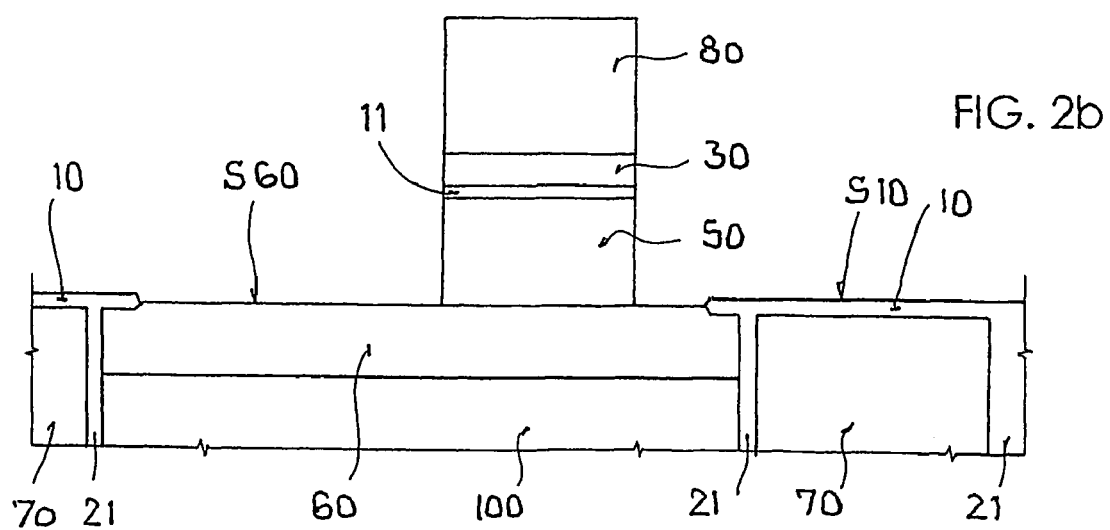
FIG. 2b illustrates a second schematic sectional view after the process steps of the manufacture of an integrated circuit.

Another process interface condition, shown in FIGS. 2a and 2b, for process interface $I_{12}$ is that a first surface region S10 has a substantially planar silicon dioxide layer 10 before application of the collector epitaxy, whereas a window is opened within silicon dioxide layer 10 for a second surface region S60, in which the collector semiconductor region 50 grows as a single crystal. The crystal lattice of connection region 60 (as a single crystal) is continued within the window above second surface region S60.

This defined process interface condition is a prerequisite for the process steps of module 2, which are shown schematically in part in FIGS. 2a and 2b. A detail of a single-crystal silicon substrate 100 on which a single-crystal connection region 60 of highly doped silicon or a silicide with a comparable lattice constant is applied epitaxially is shown in FIG. 2a.

For electrical isolation, connection region 60 is limited by trenches, the walls of the respective trench having an oxide layer 21, and the trenches being filled with polysilicon 70. An oxide layer 10 of, for example, silicon dioxide, which may be created, for example, by oxidation of the underlying silicon layer 60, 70, is applied to this arrangement. Preferably, this oxide layer 10 is made substantially planar in this case. In the region in which later collector semiconductor region 50 is to arise, a window is introduced in oxide layer 10 by removing oxide layer 10 in this region by etching. By this means, second surface region S60 within the window is formed on the single-crystal structure of connection region 60.

A silicon layer is applied epitaxially on first surface region S10 and second surface region S60, so that the crystal lattice of connection layer 60 continues as a single-crystal silicon crystal lattice 51 above second surface region S60, whereas polycrystalline silicon 52 forms on oxide layer 10 above first surface region S10.

Before an etching process to pattern collector semiconductor region 50, an oxide layer 11 and a silicon nitride layer 30 ($Si_3N_4$) acting as a hard mask and a photoresist 80 are applied to a region of the later arising collector semiconductor region 50. Then, according to FIG. 2b, first photoresist 80 of photosensitive material, then silicon nitride layer 30, the oxide layer, and the epitaxially grown silicon layer 51, 52 are patterned. In so doing, silicon layer 51, 52 is etched, and oxide layer 10 is used to stop the etching process.

If the etching front reaches silicon dioxide layer 10, this may be detected, for example, optically or by analysis of the etched material. This detection produces an endpoint signal which is then used as the input signal for the etching process, so that the etching process may be stopped as a function of the endpoint signal. The endpoint signal by the insulating silicon dioxide layer 10 also makes it possible to stop precisely within the opened window in the plane of the insulating layer 10.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for manufacturing integrated circuits having silicon-germanium heterobipolar transistors, wherein a collector semiconductor region is created by the steps comprising:

producing an etch stop layer on a connection region;

introducing an opening into the etch stop layer;

applying semiconductor material, which is formed as a single crystal at least in the collector semiconductor region above the opening, is applied over the etch stop layer and over the opening;

applying a masking layer, prior to etching of the semiconductor material, above the collector semiconductor region to the semiconductor material, which protects the collector semiconductor region from the etching; and etching the semiconductor material to a depth of the etch stop layer, the etch stop layer acting as an etch stop such that reaching an interface between the semiconductor material and the etch stop layer is detected during the etching and the etching is stopped depending on the detection.

2. The method according to claim 1, wherein the connection region is formed as a single crystal, at least in the area of the opening.

3. The method according to claim 1, wherein a silicon dioxide layer is applied as an etch stop layer.

4. The method according to claim 1, wherein silicon is applied epitaxially as the semiconductor material and doped.

5. The method according to claim 1, further comprising the steps to create the connection region:

etching of a trench in a semiconductor substrate;

creating isolation walls of the trench by a dielectric;

filling the trench by applying a silicon layer;

anisotropic back etching of the silicon layer, except for a residual layer remaining outside the trench; and oxidation of the residual layer and planarization of the oxide layer.

6. The method according to claim 1, wherein the integrated circuits has at least one silicon-germanium heterobipolar transistor.

* * * * *